(12) United States Patent
Liu

(10) Patent No.: US 8,770,679 B2
(45) Date of Patent: Jul. 8, 2014

(54) CONTAINER DATA CENTER

(75) Inventor: Hsiang-Wei Liu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 255 days.

(21) Appl. No.: 13/275,332

(22) Filed: Oct. 18, 2011

(65) Prior Publication Data

US 2012/0326583 A1 Dec. 27, 2012

(30) Foreign Application Priority Data

Jun. 24, 2011 (TW) .................................. 100122144

(51) Int. Cl.
*A47B 47/00* (2006.01)

(52) U.S. Cl.
USPC ......................................................... 312/198

(58) Field of Classification Search
USPC ............... 410/87, 88, 32, 127, 128, 122, 123, 410/151, 153; 220/23.88, 23.89; 312/198, 312/223, 243; 361/724
See application file for complete search history.

(56) References Cited

U.S. PATENT DOCUMENTS 4,056,066 A * 11/1977 Homanick ...................... 410/66
7,520,706 B2 * 4/2009 Winsor .............................. 410/7

* cited by examiner

*Primary Examiner* — Stephen Gordon
(74) *Attorney, Agent, or Firm* — Novak Druce Connolly Bove + Quigg LLP

(57) ABSTRACT

A container data center includes a container, and a number of cabinets arranged in the container. A shockproof device is mounted to the bottom of the cabinet. A supporting apparatus is mounted between the top of the cabinet and the container. The supporting apparatus includes a first sleeve fixed to the top of the container, and a second sleeve, wherein a first end of the second sleeve is slidably engaged in the first sleeve, and a second end of the second sleeve is fixed to the top of the top wall of the cabinet.

6 Claims, 4 Drawing Sheets

CONTAINER DATA CENTER

CROSS-REFERENCE TO RELATED APPLICATIONS

Relevant subject matter is disclosed in three U.S. patents, all titled "CONTAINER DATA CENTER", with the U.S. Pat. Nos. 8,602,701, 8,419,328, 8,500,377, respectively, and one pending U.S. patent application, titled "CONTAINER DATA CENTER", with the application Ser. No. 13/273,242, filed on Sep. 21, 2011, Sep. 25, 2011, Oct. 12, 2011, and Oct. 14, 2011, respectively, which are assigned to the same assignee as this patent application.

BACKGROUND

1. Technical Field

The present disclosure relates to a container data center.

2. Description of Related Art

A container data center usually includes a container, and many cabinets each holding many servers and received in the container. However, during transportation of the container data center, the servers may be damaged due to vibration or shocks.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
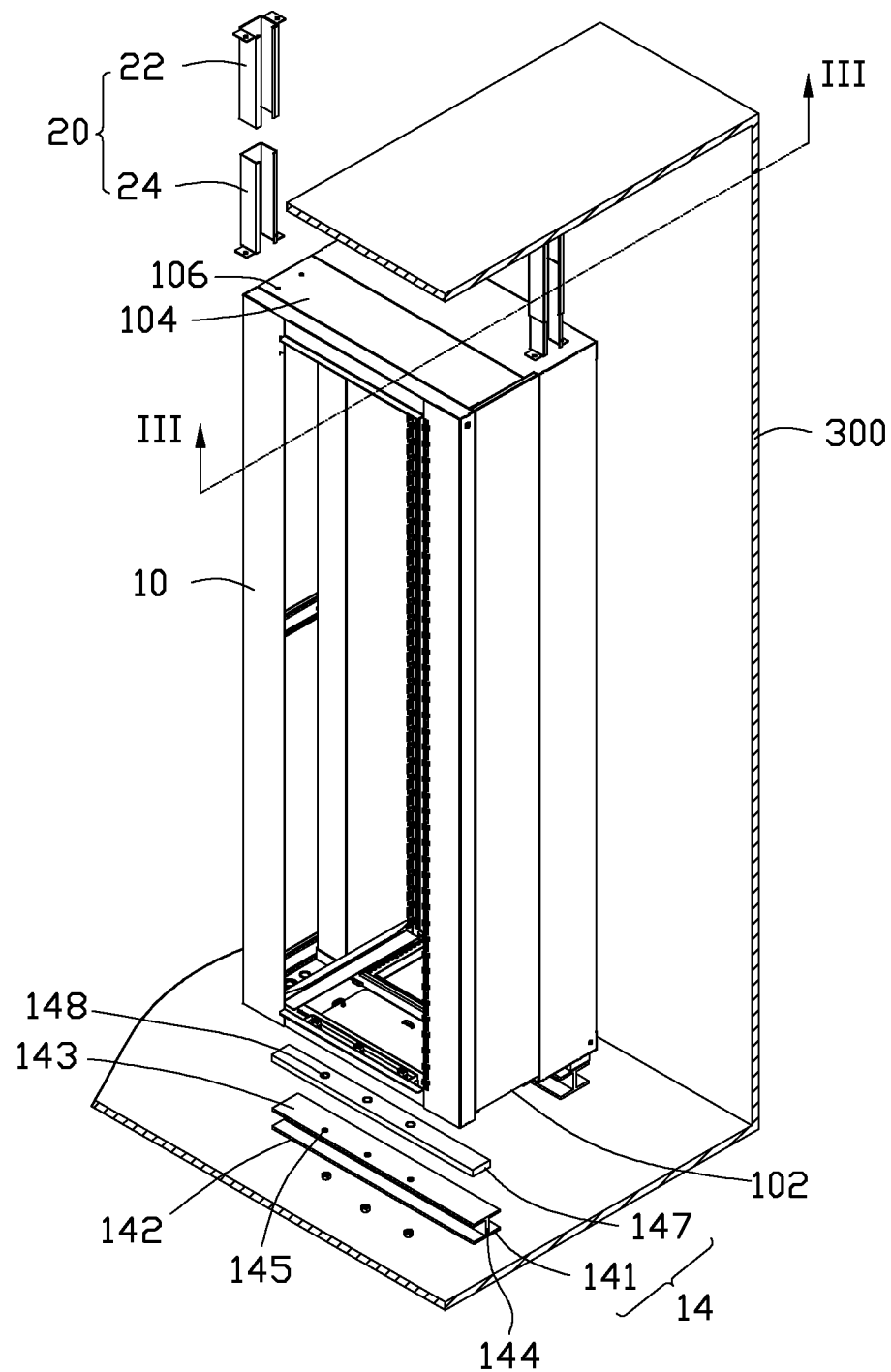
FIG. 1 is an exploded, isometric and cutaway view of an exemplary embodiment of a container data center, wherein the container data center includes a number of supporting apparatuses.

Referring to FIG. 1, an exemplary embodiment of a container data center includes a container 300, and a number of cabinets 10 arranged in the container 300.

The inner surface of the top wall of the container 300 defines a plurality of attachment holes. Each cabinet 10 includes a bottom wall 102 and a top wall 104 opposite to the bottom wall 102. A pair of shockproof devices 14 is mounted to the underside of the bottom wall 102, and two supporting apparatuses 20 are mounted to the top of the top wall 104. The bottom wall 102 defines a plurality of through holes. The top wall 104 defines two pairs of fastening holes 106 which are diagonally opposite each other. One or more servers may be installed in each cabinet 10.

Each shockproof device 14 includes a support 141, H-shaped in section, and a shockproof member 147.

The support 141 is made up of a long bottom plate 142, a long top plate 143 parallel to the bottom plate 142, and a connecting plate 144 perpendicularly connected between the centers of the bottom plate 142 and the top plate 143. The top plate 143 defines three fixing holes 145, at one side of the connecting plate 144.

The shockproof member 147 is made of shockproof material, such as plastic or rubber. The shockproof member 147 is a bar of material, and substantially equal in length to the top plate 143. The shockproof member 147 defines three through holes 148.

Figure 2:
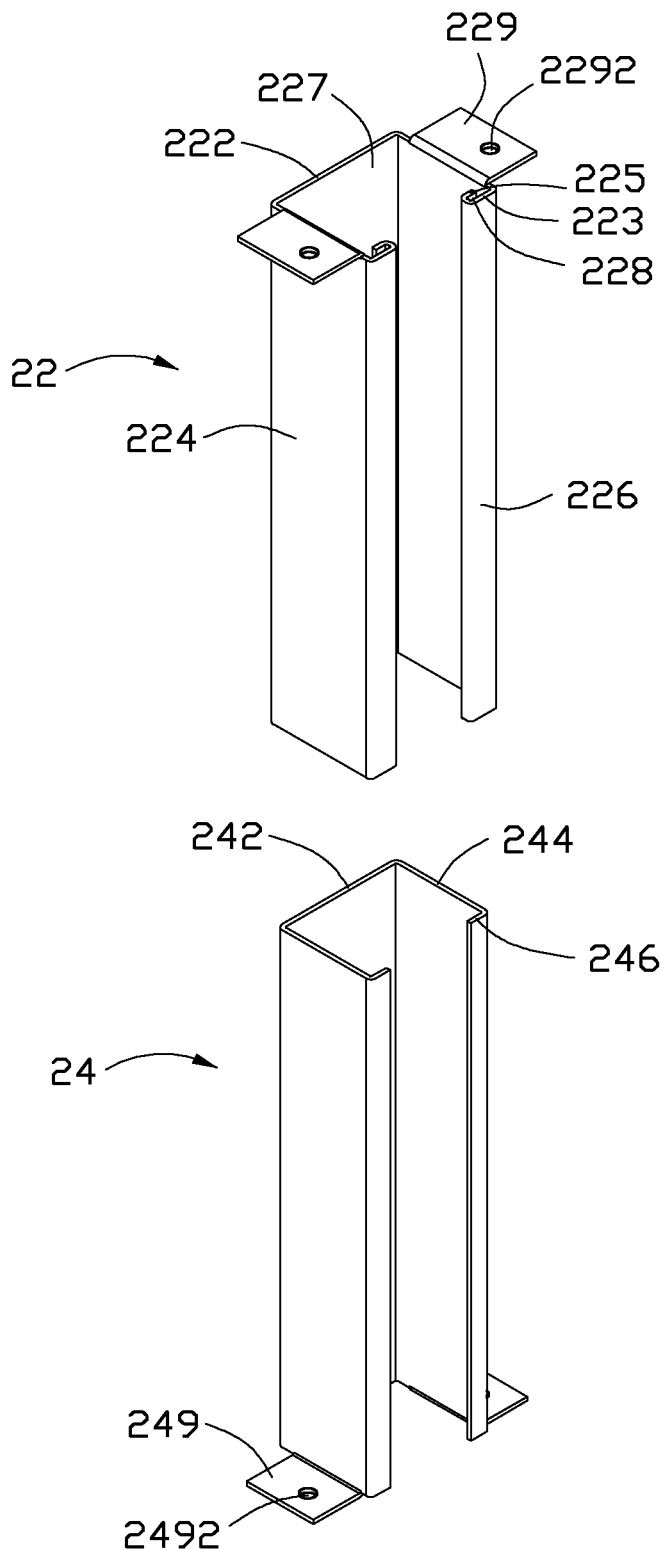
FIG. 2 is an enlarged view of one of the supporting apparatuses of FIG. 1.

Referring to FIG. 2, each supporting apparatus 20 includes a first sleeve 22, substantially U-shaped in section, and a second sleeve 24, also substantially U-shaped in section.

The first sleeve 22 includes a rectangular connecting plate 222, two opposite side plates 224 perpendicularly extending from two sides of the connecting plate 222, and two inwardly-hemmed interior flanges (guiding portions 226) extending towards each other from the sides of the side plates 224 opposite to the connecting plate 222. The connecting plate 222 and the side plates 224 cooperatively bound a receiving space 227. Each guiding portion 226 includes an extending plate 223 perpendicularly extending from a corresponding side plate 224 toward the other side plate 224, and a substantially L-shaped latching plate 225 extending in from the side of the extending plate 223 opposite to the side plate 224. Each extending plate 223 and the corresponding latching plate 225 cooperatively bound a guiding slot 228. A fixing plate 229 perpendicularly extends out from the top end of each side plate 224, and defines a through hole 2292.

The second sleeve 24 includes a rectangular connecting plate 242, two opposite side plates 244 perpendicularly extending from two sides of the connecting plate 222, and two simple flanges 246 perpendicularly extending towards each other from the sides of the side plates 244 opposite to the connecting plate 242. A fixing plate 249 perpendicularly extends out from the bottom end of each of the side plates 244, and each fixing plate 249 defines a through hole 2492.

Figure 3:
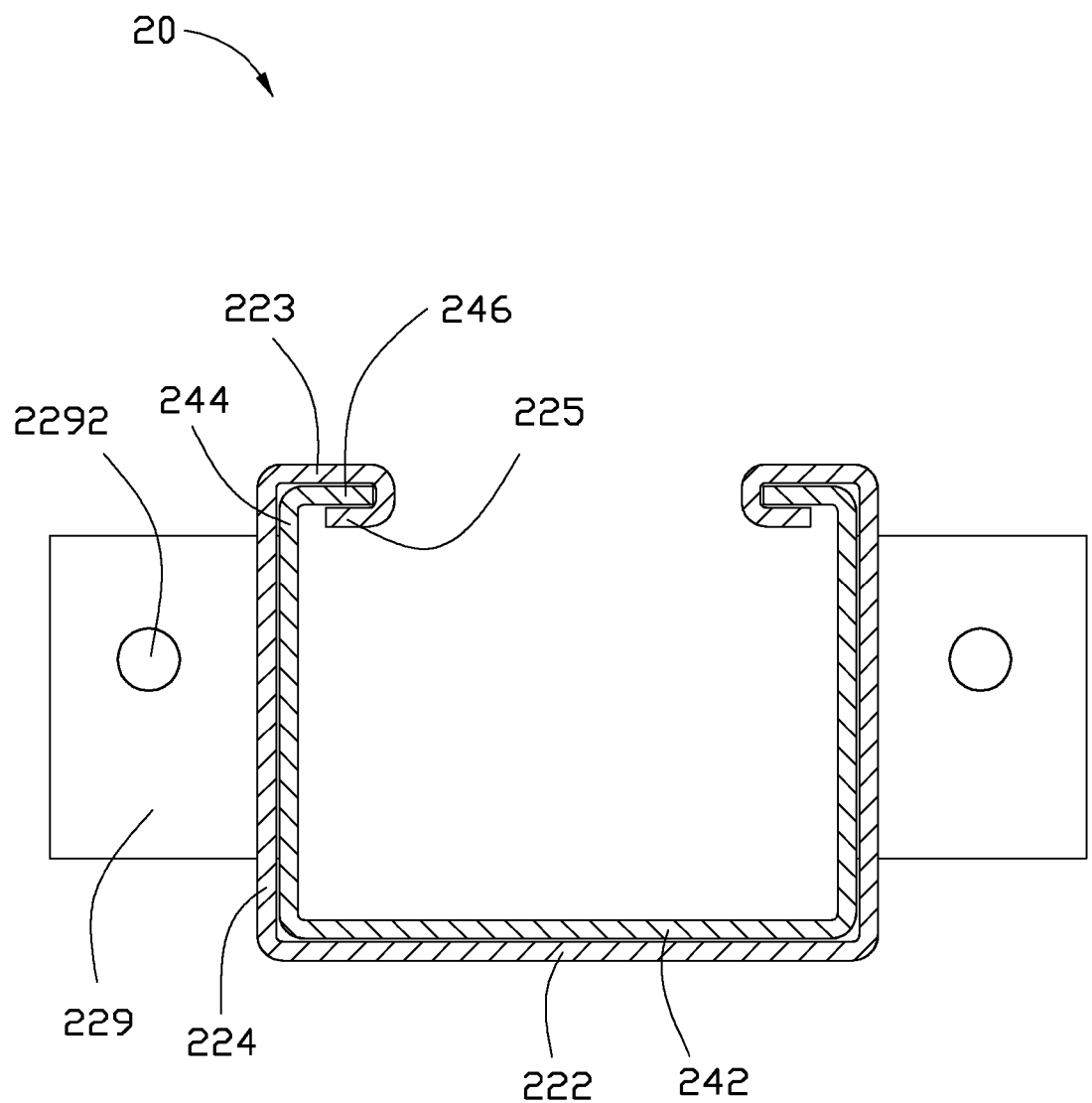
FIG. 3 is a cross-sectional view of the device of FIG. 1, taken along the line III-III.
Figure 4:
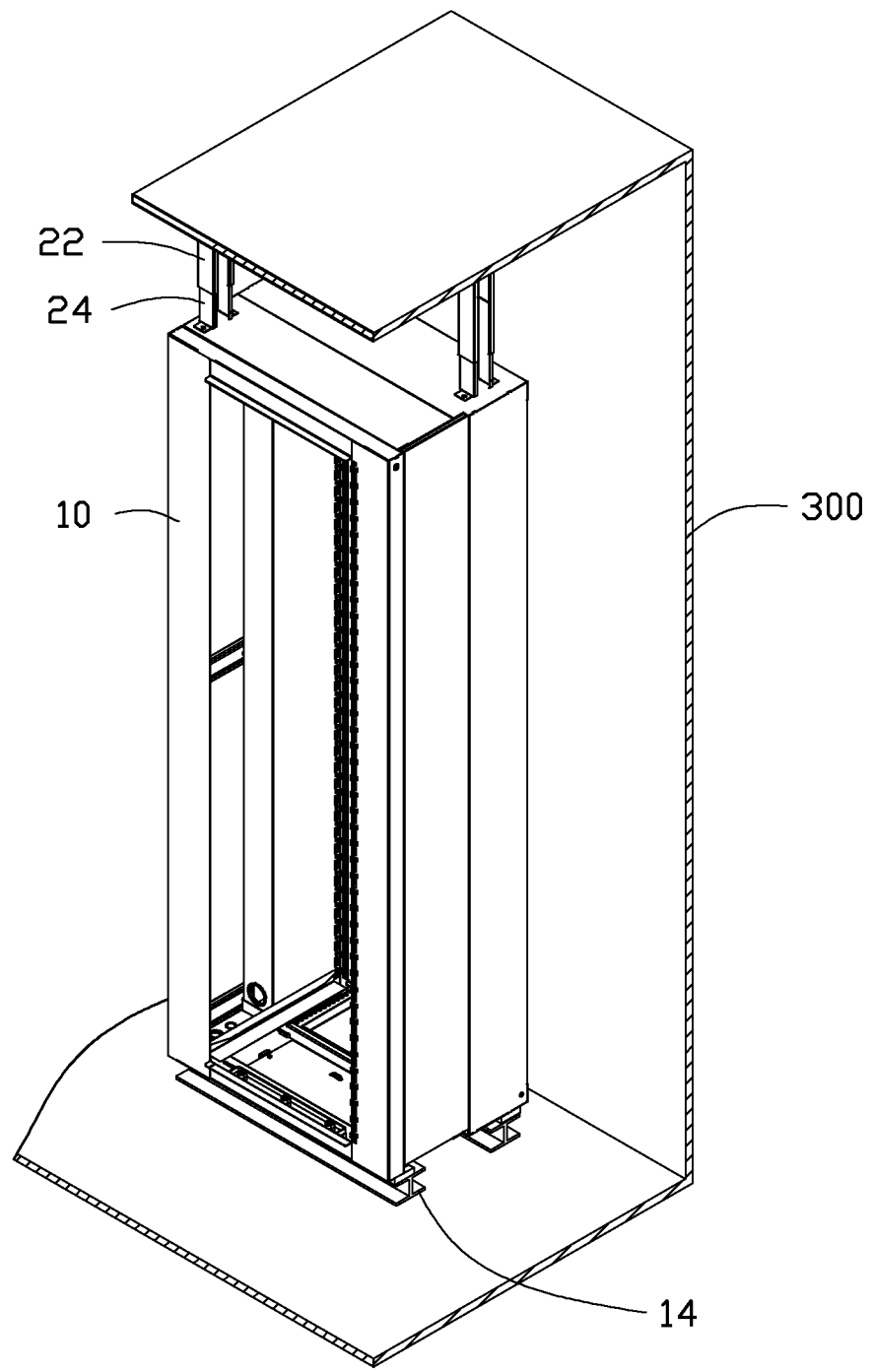
FIG. 4 is an isometric view of the assembled container data center of FIG. 1.

Referring to FIGS. 3-4, in assembly, all the parts of the shockproof devices 14 are mounted to the bottom wall 102, and secured by three screws and nuts through the bottom wall 102.

Each second sleeve 24 is slidably inserted into the bottom end of the first sleeve 22. Screws extend through the through holes 2492 of the second sleeve 24, to be screwed into the corresponding fastening holes 106. Each cabinet 100 is fixed to the container 300 by means of the bottom plate 142 being screwed or riveted to the bottom of the container 300. Screws extend through the through holes 2292 of the first sleeve 22, to be screwed into the corresponding attachment holes at the top of the container 300. Each supporting apparatus 20 is the connection between the top wall 104 and the top of the container 300. The first sleeve 22 is free to slide in the second sleeve 24.

When the container 300 is shaken, the shockproof member 147 absorbs the energy of the vibrations or shocks, and the supporting apparatus 20 prevents the top of the cabinet 100 moving in any lateral direction.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center comprising:
    a container;
    a cabinet arranged in the container, the cabinet comprising a top wall and a bottom wall; and
    a supporting apparatus mounted between a top of the top wall of the cabinet and an inner surface of a top of the container, and comprising a first sleeve fixed to the top of the container, and a second sleeve, wherein a first end of the second sleeve is slidably engaged in the first sleeve, and a second end of the second sleeve is fixed to the top of the top wall of the cabinet;
    wherein the first sleeve defines a receiving space, the second sleeve is slidably received in the receiving space; and
    wherein the first sleeve comprises a first connecting plate, and two opposite first side plates extending from opposite sides of the first connecting plate, the first connecting plate and the first side plates cooperatively bound the receiving space.

2. The container data center of claim 1, wherein the first sleeve further comprises two guiding portions extending from the first side plates for limiting the second sleeve.

3. The container data center of claim 2, wherein each guiding portion comprises an extending plate extending from a side of the respective first side plate opposite to the first connecting plate toward the other first side plate, and a substantially L-shaped latching plate extending in from a side of each extending plate opposite to the respective first side plate, the extending plate and the respective latching plate cooperatively bound a guiding slot for slidably receiving a corresponding side of the second sleeve.

4. The container data center of claim 3, wherein the second sleeve comprises a second connecting plate, two opposite second side plates extending from the second connecting plate, and two flanges extending in from sides of the second side plates opposite to the second connecting plate, the second connecting plate is slidably engaged with the first connecting plate, the second side plates are engaged with corresponding ones of the first side plates, the flanges are slidably engaged in corresponding ones of the guiding slots.

5. The container data center of claim 1, further comprising a shockproof device, wherein the shockproof device comprises a support, and a shockproof member made of shockproof material and sandwiched between the support and the cabinet, a plurality of screws extends through the bottom wall of the cabinet, the shockproof member, and the support, to be screwed into corresponding nuts.

6. A container data center comprising:
    a container;
    a cabinet arranged in the container, the cabinet comprising a top wall and a bottom wall;
    a supporting apparatus mounted between a top of the top wall of the cabinet and an inner surface of a top of the container, and comprising a first sleeve fixed to the top of the container, and a second sleeve, wherein a first end of the second sleeve is slidably engaged in the first sleeve, and a second end of the second sleeve is fixed to the top of the top wall of the cabinet; and
    a shockproof device, wherein the shockproof device comprises a support, and a shockproof member made of shockproof material and sandwiched between the support and the cabinet, a plurality of screws extends through the bottom wall of the cabinet, the shockproof member, and the support, to be screwed into corresponding nuts.

* * * * *